US007402984B1

(12) United States Patent
Huang

(10) Patent No.: US 7,402,984 B1
(45) Date of Patent: Jul. 22, 2008

(54) OSCILLATION SENSOR FOR LINEAR REGULATION CIRCUIT

(75) Inventor: Shengming Huang, Gourock (GB)

(73) Assignee: National Semiconductor Corporation, Santa Clara, CA (US)

( * ) Notice: Subject to any disclaimer, the term of this patent is extended or adjusted under 35 U.S.C. 154(b) by 400 days.

(21) Appl. No.: 11/078,969

(22) Filed: Mar. 9, 2005

(51) Int. Cl.
*G05F 1/00* (2006.01)
*H03F 3/45* (2006.01)

(52) U.S. Cl. ........................ 323/274; 323/280; 330/257

(58) Field of Classification Search ................. 323/226, 323/273-276, 279, 280; 327/54; 330/257, 330/292
See application file for complete search history.

(56) References Cited

U.S. PATENT DOCUMENTS 6,516,672 B2 * 2/2003 Wang .......................... 73/718
6,603,292 B1 * 8/2003 Schouten et al. ............ 323/277
6,750,638 B1 6/2004 Gang
6,850,118 B2 * 2/2005 Hanafusa et al. ............ 330/297
2002/0153946 A1 * 10/2002 Nguyen .......................... 330/9
2003/0102908 A1 * 6/2003 Ausserlechner et al. ......... 330/9
2003/0117224 A1 * 6/2003 Korner ....................... 331/158
2003/0189540 A1 * 10/2003 Itakura et al. ................. 345/89
2006/0153431 A1 * 7/2006 Ando ......................... 382/124
2006/0226898 A1 * 10/2006 Vitunic et al. .................. 330/9

FOREIGN PATENT DOCUMENTS

JP 62043913 A * 2/1987

* cited by examiner

*Primary Examiner*—Gary L Laxton
*Assistant Examiner*—Ramy Ramadan
(74) *Attorney, Agent, or Firm*—Darby & Darby P.C.; John W. Branch

(57) ABSTRACT

An oscillation sensor for a regulator that provides dynamic control of a connection/disconnection of a compensation capacitance. The compensation capacitor is disconnected under normal operation and is automatically connected if oscillation is detected in the output and regulator's error amplifier. In this way, oscillations are stopped in the regulator almost immediately after it occurs. Also, once the circuit is stable again, the compensation capacitor is quickly disconnected again. Consequently, the compensation capacitor does not adversely affect the overall performance of the regulator.

20 Claims, 7 Drawing Sheets

OSCILLATION SENSOR FOR LINEAR REGULATION CIRCUIT

FIELD OF THE INVENTION

The invention is directed to linear regulators, and more particularly, the present invention is directed to a sensor that can dynamically control oscillation in a linear regulator.

BACKGROUND OF THE INVENTION

Previously, the designs of low drop out (LDO) regulators with low output load/line transients and relatively high PSRRs have had to sacrifice gain/phase margins. Also, this type of regulator design tended to oscillate when operating at or near its dropout voltage if the input/output line parasitic inductance was higher or the output capacitance was lower than some value required for some applications.

Since device modeling is typically not accurate enough to detect the causes of this type of oscillation, they have been difficult to predict with simulations at low or high temperatures even if the regulator is operating at a relatively normal input voltage. Also, under certain conditions, oscillation can be triggered by transient noise, such as a full load transient. For example, bench tests have shown this type of LDO regulator with 2.8V output voltage starts to oscillate if a wire connected to its input pin is long and a full load transient occurs near its dropout voltage (around 3.0V). Further, this type of LDO regulator has been known to start to oscillate at full load transient when the input inductance increased to 70 nH with an output capacitance of 0.7 μF. Similarly, if this output capacitance is increased to 1.0 μF, this type of LDO regulator often starts to oscillate when the input inductance is increased to 90 nH.

Furthermore, since the input/output line inductance and output capacitance are typically related to a particular application that employs an LDO regulator, which can vary significantly from application to application or even from chip package to chip package, previous LDO regulators were prone to oscillation under various conditions.

DETAILED DESCRIPTION OF THE INVENTION

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

The invention is directed to removing oscillations in linear regulator applications with an oscillation sensor that enables dynamic control of a connection of a compensation capacitance for an error amplifier's first and second stages of the regulator. In this way, the invention enables the regulator to exhibit relatively high Power Supply Rejection Ration (PSRR), low output load/line transient and good stability. By using the invention, a regulator can be more flexible in its application and optimized to its maximum limits. Also, simulations have shown that the invention enables a regulator to be very stable under a wide variety of different conditions.

The oscillation sensor is employed to stabilize oscillations in an error amplifier to enable a regulator to generally operate without oscillating in a wide variety of different applications and conditions. Although the connection of a compensation capacitor has been shown to be effective for relatively stable (non-oscillation) operation, the use of such a compensation capacitor previously caused a slow down in the response speed of the error amplifier, which had led to relatively large output load/line transients and a relatively low PSRR for the regulator.

In contrast, the invention provides dynamic control of the connection/disconnection of a compensation capacitance with an oscillation sensor. The compensation capacitor is disconnected under normal operation and is automatically connected if oscillation is detected from the output and thereby in the regulator's error amplifier. In this way, oscillations are stopped in the regulator almost immediately after it occurs. Also, once the circuit is stable again, the compensation capacitor is quickly disconnected again. Consequently, the compensation capacitor does not adversely affect the overall performance of the regulator. In one embodiment where the invention employed in a regulator with 15 pF compensation capacitors, the regulator has been found to be stable even with a 0.3 μH input inductance condition.

Figure 1A:
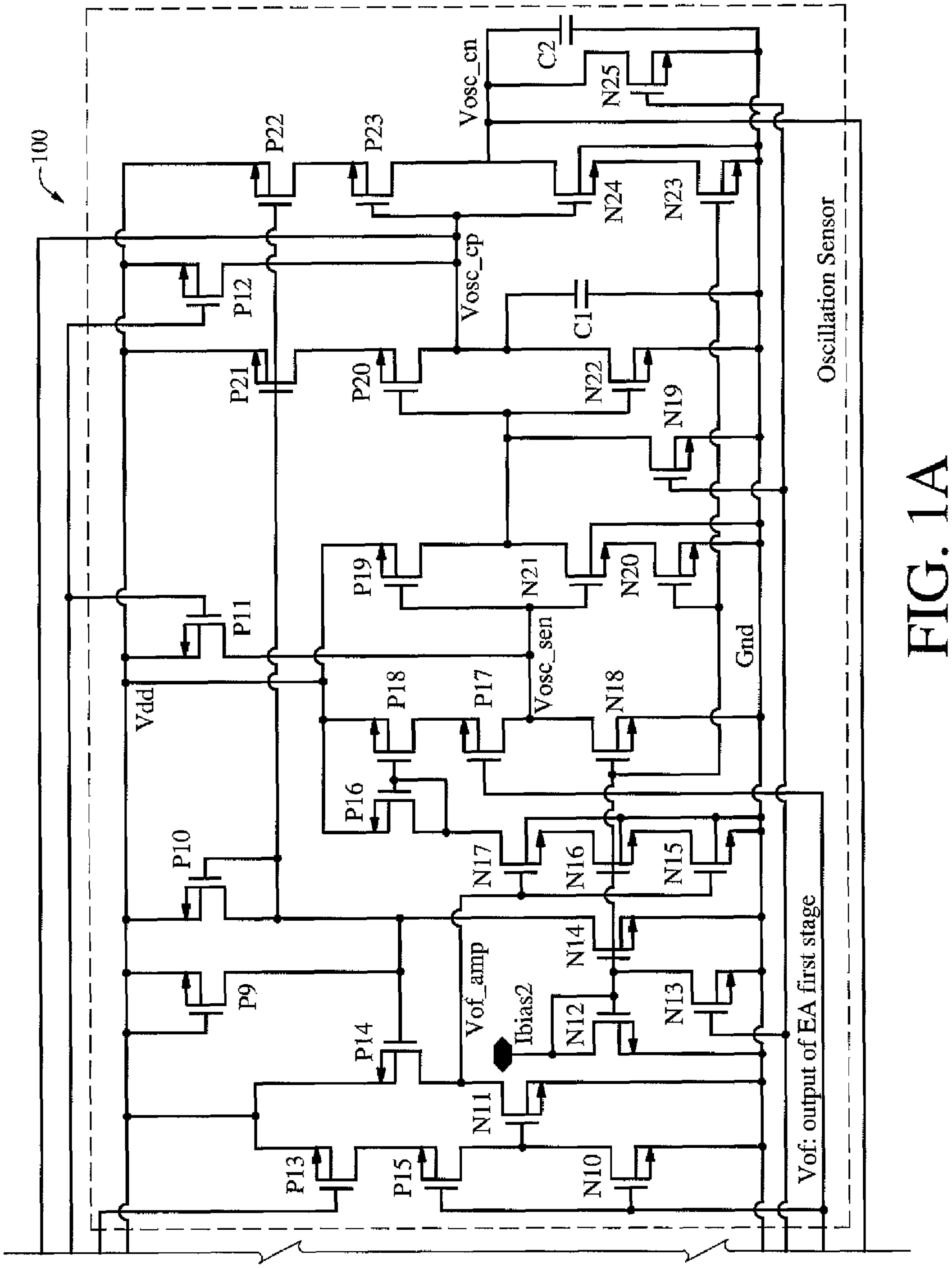
FIG. 1 is a schematic of an oscillation sensor that dynamically controls a compensation capacitance between the first and second stages of a regulator's error amplifier.
Figure 1B:
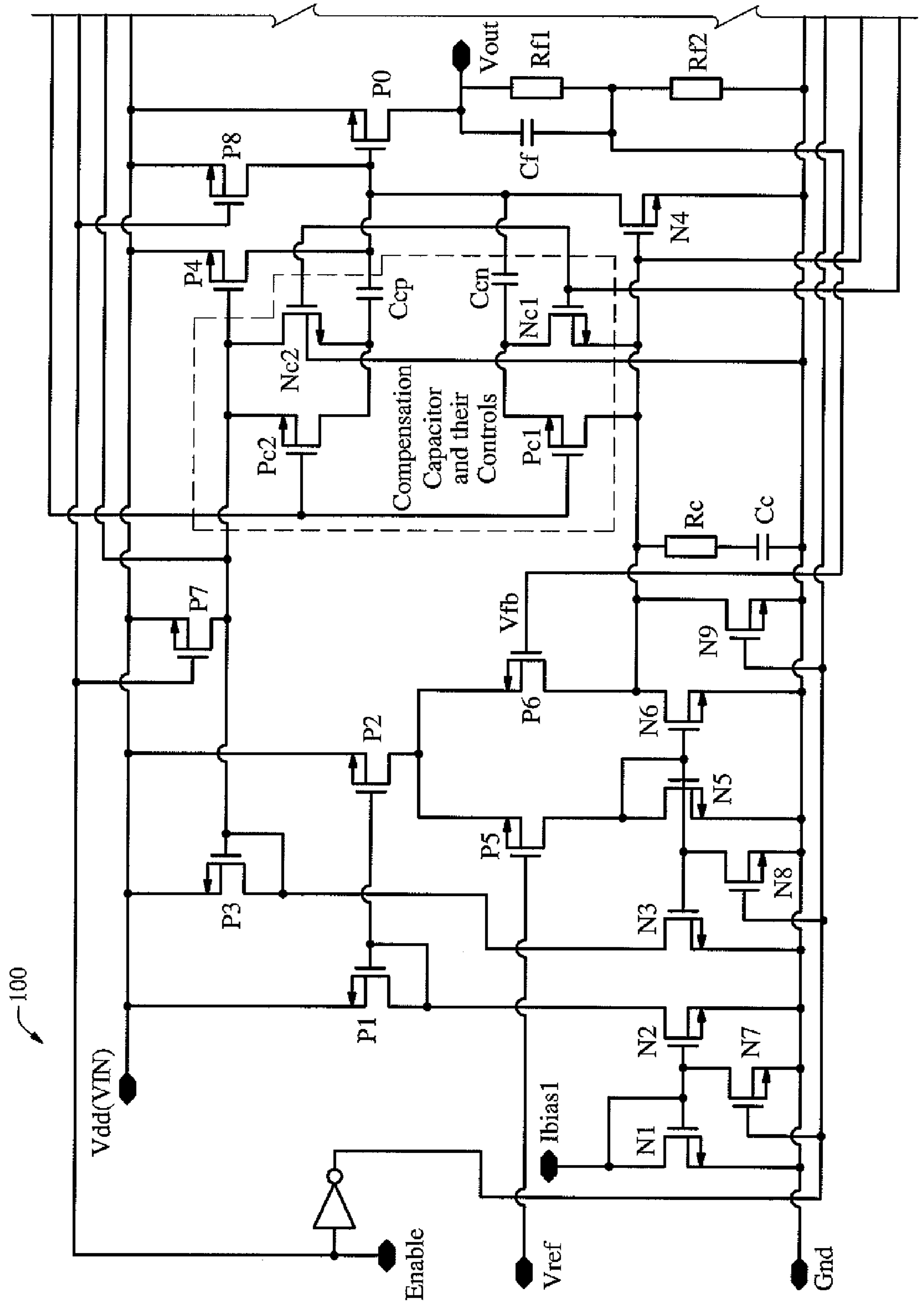

FIG. 1 shows schematic of regulator 100 that includes an error amplifier with multiple stages, pass device P0 and feedback resistors/capacitor Rf1, Rf2 and Cf. In this embodiment, the error amplifier includes an oscillation sensor as shown in a dashed-line frame. Also, in another dashed-line frame, the compensation capacitors Ccn and Ccp and their control PMOSFETs Pc1, Pc2 and NMOSFETs Nc1, Nc2 are shown. Additionally, for the oscillation sensor, PMOSFETs P16 and P18 (P16 and P18 have identical Width/Length size), and NMOSFETs N12 and N16, N12 and N18 constitute respective current mirrors. Further, current source N16 and P16/P18 are also controlled by N15 and N17, which can be switched on and off by the amplified signal Vof_amp of Vof (which is the output signal of the error amplifier's first stage). Vdd is also the input voltage to the regulator. Vref is the reference voltage, which is coupled to the negative input of the error amplifier.

Under normal operating conditions, both input voltages of the error amplifier are equal (Vfb=Vref), so that NMOSFET current mirror load N5 and N6 conduct the same current (half of the tail current flowing through P2). If the matching between P5 and P6, N5 and N6 is relatively good, the drain-source voltage Vds of N6 is also equal to the drain-source voltage Vds (Vds=Vgs) of N5, and N6 also operates in its saturation region. In this way, the gate-source voltage Vgs of N10 equals the gate-source voltage Vgs of N5. In this embodiment, the Width/Length size of N10 is arranged to be relatively ¼ of that of N5 and N6. Also, if the current flowing through N5 and N6 is I0, the current source of P13 flowing through P15 and N10 is designed to be less than ⅛ of I0. In this way, N10 is forced to operate in linear region with its Vds<Vgs (significantly less). Otherwise, N10 would conduct a current, which equals ¼ of I0 due to its gate-source voltage Vgs that is relatively identical to the gate source voltages of N5 and N6.

In normal operation, N11 tends to operate in its off state and a logic high for Vof_amp can be reliably attained with a relatively smaller Width/Length size of N11 than that of N10 and a similar current source of P14 as P13. Also, N15 and N17 turn-on fully and operate in their linear region, and they do not significantly affect the current flowing through N16 and P16. Vosc_sen is a sense point, which is charged by P18 and discharged by N18. By designing a larger Width/Length size of N16 than that of N18, the current flowing through P18 is relatively bigger than that of N18. Typically, the size ratio between N16 and N18 is 1.1~1.5, but less than 2. In this configuration, Vosc_sen is logic high under normal operation.

Also, once oscillation starts to occur, N6 tends to conduct higher and lower current repeatedly, which causes Vof to oscillate and behave as a sine wave. Since the Width/Length size of N10 is relatively smaller than that of N6, N10 tends to turn-off fully in the negative half cycle of Vof, which leads to a full on-state of N11, e.g., an amplified logic low of Vof_amp. In this case, N15 and N17 turn-off fully in the negative half cycle of Vof and may still turn-on in the positive half cycle, which results in a smaller average current of P18 than that of N18. In this way, Vosc_sen becomes logic low, e.g., Vosc_sen changes state once oscillation takes place. P15 and P17 act as resistors and the equivalent resistor value varies with Vof. P9, P11, P12, N13, N19 and N25 are disable transistors. Typically, the total quiescent current required by the oscillation sensor is less than 1 μA.

The three stages between Vosc_sen and Vosc_cn are arranged as time and logic control stages. Typically, there is relatively no static current flowing through these stages. Also, Vosc_cn and Vosc_cp are the inverting and non-inverting states of Vosc_sen, respectively. Furthermore, C1 and C2 are typically valued at around 1 pF capacitors in this embodiment. Additionally, Vosc_cn and Vosc_cp are used to control the connection/disconnection of compensation capacitors Ccn and Ccp between the first stage and second stage of the error amplifier.

In particular, during oscillation, MOS transistors Pc1 and Pc2 are turned on by signal Vosc_cp and MOS transistors Nc1 and Nc2 are turned on by Vosc_cn to connect compensation capacitors Ccn and Ccp between the error amplifier's first and second stages. Also, if no oscillation occurs, MOS transistors Pc1 and Pc2 are turned off by Vosc_cp and Nc1 and Nc2 are turned off by Vosc_cn. And the compensation capacitors Ccn and Ccp are disconnected. Therefore, once the error amplifier starts to oscillate, Ccn and Ccp are connected and the error amplifier is stabilized. Under normal operation, Ccn and Ccp are disconnected and they do not adversely affect the performance of the error amplifier.

Additionally, in another embodiment, if MOS transistor Pc2 is increased to a physical size where its resistance is lowered sufficiently, then MOS transistor Nc2 can be eliminated and the invention can operate in substantially the same manner as the discussed above that embodiment that does include Nc2.

In this way, low output load/line transients and high PSRR can be achieved. Additionally, the feedback capacitor Cf can also be controlled (connected in normal operation and disconnected once oscillation occurs) as needed.

Simulation Graphs

Figure 2:
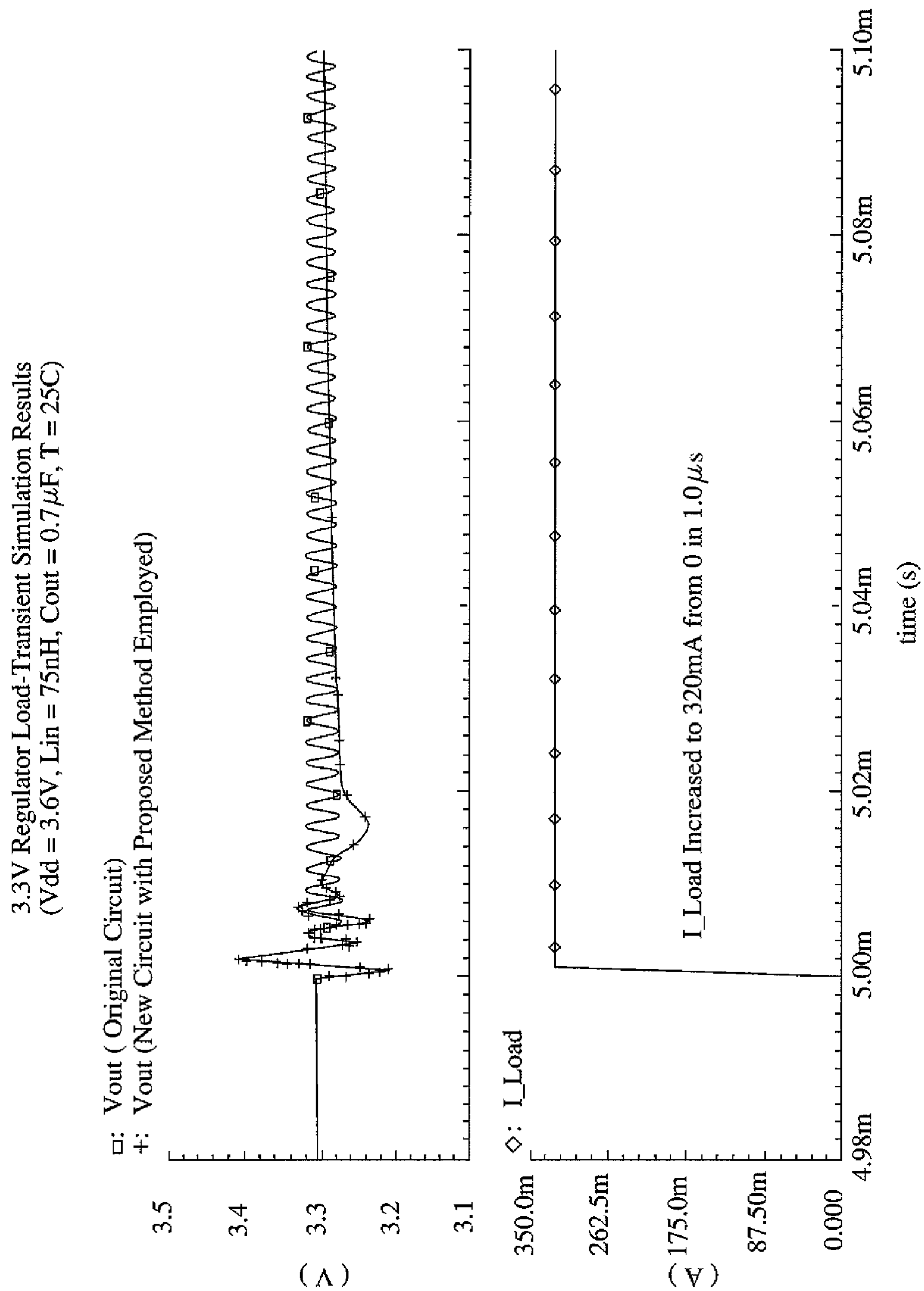
FIGS. 2-5 illustrate simulations that have been carried out over temperature and under various conditions.

FIGS. 2-5 illustrate simulations that have been carried out over temperature and under various conditions. In these figures, a regulator rated at 3.3 volts is operated with a 10 pF capacitor for Ccn and a 5 pF for capacitor Ccp. As can be seen in FIG. 2, a Cout=0.7 μF and operating at around drop-out voltage (Vdd=3.6V), a regulator without the invention starts to oscillate with the input inductance Lin increased to 75 nH when a full load is applied transiently. However, a regulator that includes the invention does not oscillate under the same conditions.

Figure 3:
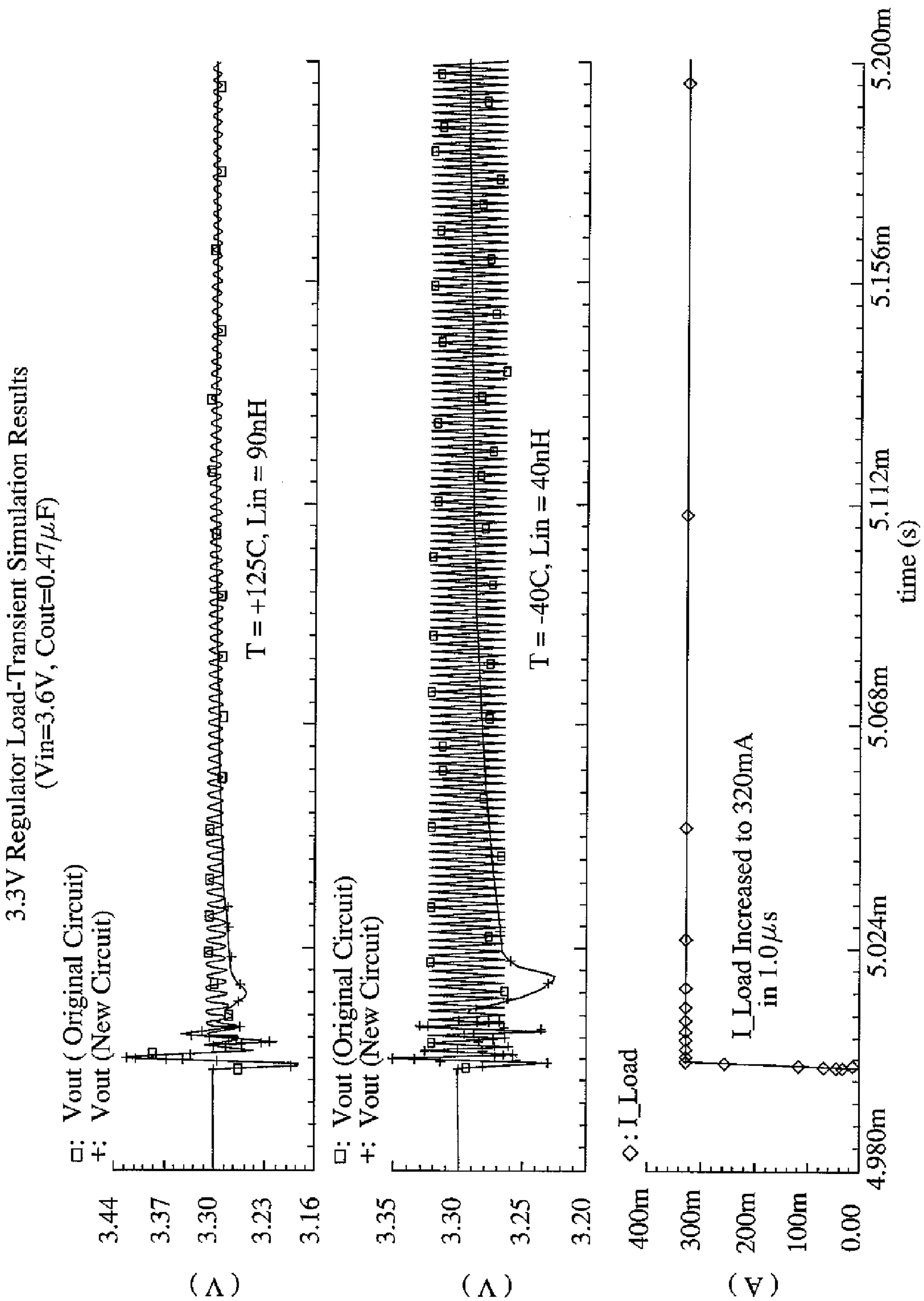

As shown in FIG. 3, if Cout=0.47 μF, the regulator oscillates when Lin increased to 90 nH at T=125° C. For example, at a low temperature (T=−40° C.), the regulator starts to oscillate when Lin increased to 40 nH. However, at both of these temperatures, the regulator that includes the invention does not oscillate.

Figure 4:
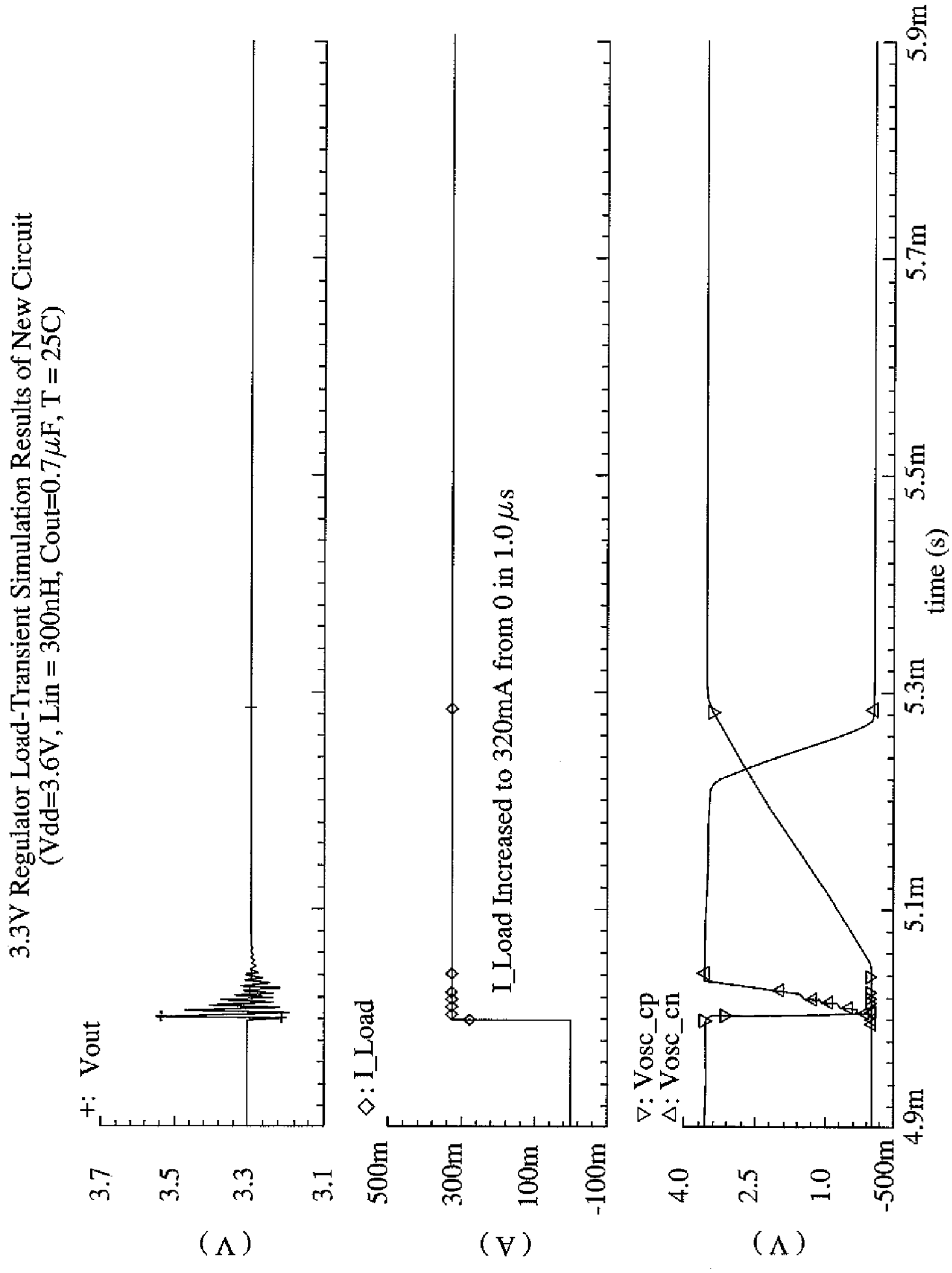

Additionally, as shown in FIG. 4, the regulator that includes the invention does not oscillate even if Lin=300 nH. Transient variations of Vosc_cp and Vosc_cn are also shown in this figure.

Figure 5:
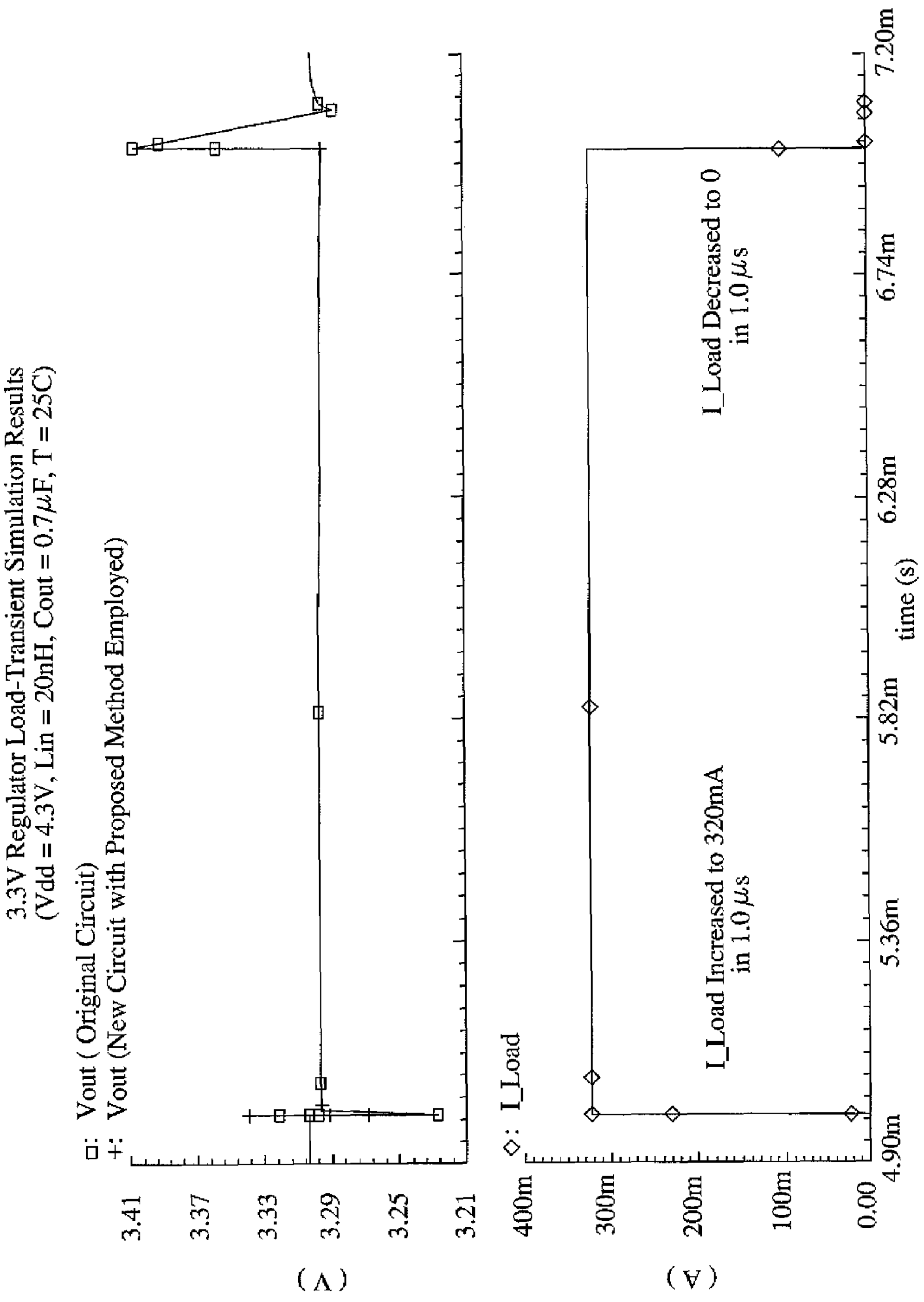

In FIG. 5, at a relatively normal input voltage of 4.3V and with a reasonable 20 nH input line inductance (oscillation does not occur at load transient even in the regulator that does not include the invention), the output load transient results for both regulator circuits are shown. As illustrated, both regulators show relatively the same transient variation in Vout. Also, simulations have shown that both regulators have substantially the same PSRR.

Figure 6:
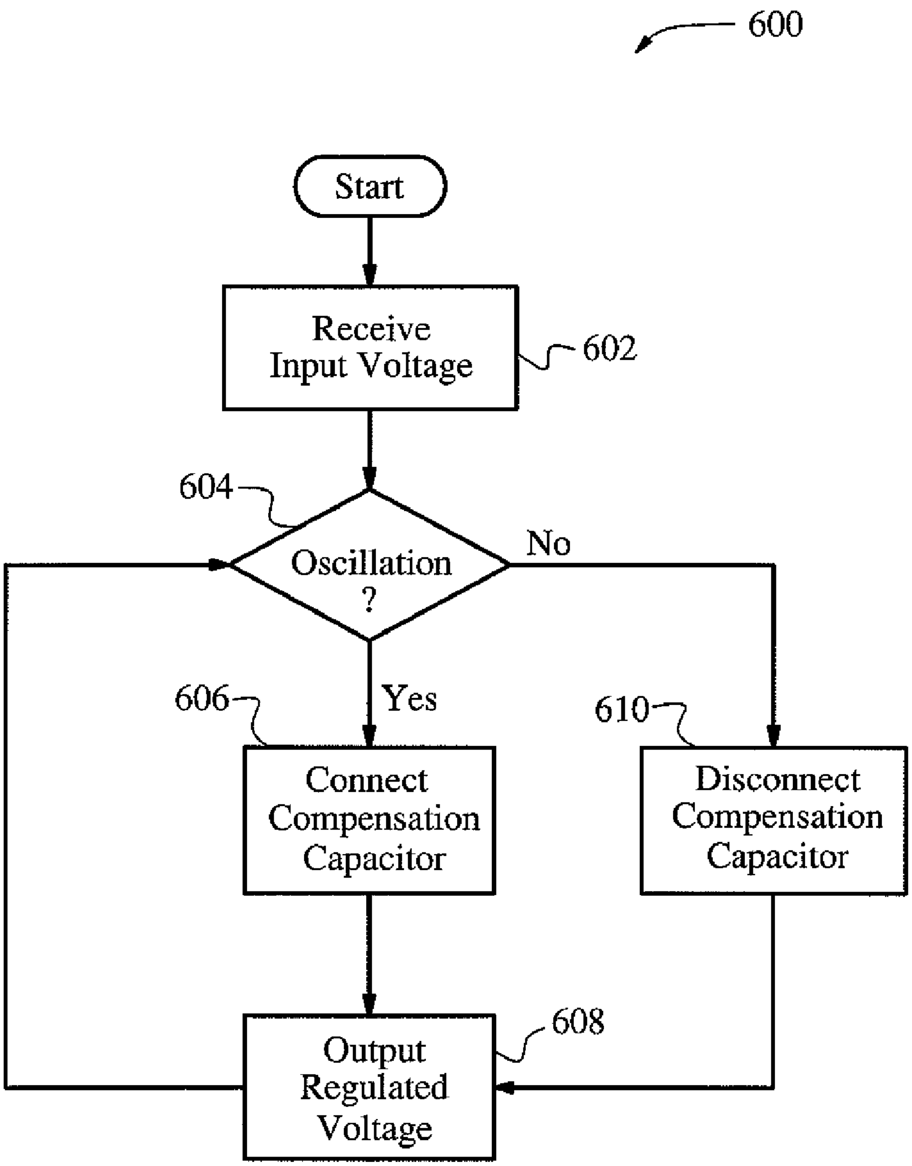
FIG. 6 shows a method for removing oscillation in a regulator, in accordance with the present invention.

FIG. 6 illustrates a flow chart of method 600 for controlling oscillation in the output of a regulator. Moving from a start block, the process flows to block 602 where an input voltage is received. At decision block 604, a determination is made as to whether an oscillation is sensed from output and thereby from the point between a first stage and a second stage of an error amplifier coupled to the input voltage and the output voltage of the regulator. If true, the process advances to block 606 where a compensation capacitance is coupled to the first stage and second stage of the error amplifier. The process advances to block 608 where a regulated output voltage is provided without oscillation. From block 608, the process loops back to decision block 604 and again checks to see if an oscillation is detected.

However, if the determination at decision block 604 had been false, the process would have stepped to block 610 where the compensation capacitor is disconnected from the first stage and second stage of the error amplifier. The process steps to block 608 and performs substantially the same actions as discussed above.

The above specification, examples and data provide a complete description of the manufacture and use of the composition of the invention. Since many embodiments of the invention can be made without departing from the spirit and scope of the invention, the invention resides in the claims hereinafter appended.

What is claimed as new and desired to be protected by Letters Patent of the United States is:

1. A voltage regulator, comprising:

an input stage that receives an input voltage;

an output stage that regulates an output voltage based on a reference voltage and the input voltage; and an error amplifier with a sensor having a first stage and a second stage that are coupled between the reference voltage and an output voltage, wherein if an oscillation is sensed at a node coupled to the output voltage and disposed between the first stage and the second stage, a compensation capacitance is connected between the first stage and second stage of the error amplifier, and wherein if oscillation is undetected between the first and second stage of the error amplifier, the compensation capacitance is disconnected from these two stages.

2. The apparatus of claim 1, further comprising a feedback capacitor that is coupled to the output stage.

3. The apparatus of claim 2, wherein the feedback capacitor is disconnected if oscillation is detected by the sensor, and wherein the feedback capacitor is connected if oscillation is undetected by the sensor.

4. The apparatus of claim 1, further comprising an NMOS transistor and a PMOS transistor to control the connection and disconnection of a first compensation capacitor to a low side of the error amplifier's first stage.

5. The apparatus of claim 1, further comprising an NMOS transistor and a PMOS transistor to control the connection and disconnection of a second compensation capacitor to a high side of the error amplifier's first stage.

6. The apparatus of claim 1, further comprising a PMOS transistor to control the connection and disconnection of a second compensation capacitor to a high side of the error amplifier's first stage.

7. The apparatus of claim 1, wherein the regulator is a low drop out (LDO) regulator.

8. A voltage regulator, comprising:

an input stage that receives an input voltage;

an output stage that regulates an output voltage based on a reference voltage and the input voltage; and an error amplifier that includes a sensor, wherein if an oscillation is sensed at a node coupled to the output voltage and disposed between a first stage and a second stage of the error amplifier, a first compensation capacitor is connected between the second stage and a low side of the error amplifier's first stage and a second compensation capacitor is connected between the second stage and a high side of the error amplifier's first stage, and wherein if oscillation is undetected between the first and second stage of the error amplifier, the first compensation capacitor is disconnected from the low side of the error amplifier's first stage and the second compensation capacitor is disconnected from the high side of the error amplifier's first stage.

9. The apparatus of claim 8, further comprising an NMOS transistor and an PMOS transistor to control the connection and disconnection of the first compensation capacitor to the low side of the error amplifier's first stage.

10. The apparatus of claim 8, further comprising an NMOS transistor and an PMOS transistor to control the connection and disconnection of the second compensation capacitor to the high side of the error amplifier's first stage.

11. The apparatus of claim 8, further comprising an PMOS transistor to control the connection and disconnection of the second compensation capacitor to the high side of the error amplifier's first stage.

12. The apparatus of claim 8, wherein the regulator is a low drop out (LDO) regulator.

13. The apparatus of claim 8, further comprising a feedback capacitor that is coupled to the output stage.

14. The apparatus of claim 8, wherein the feedback capacitor is disconnected if oscillation is detected by the sensor, and wherein the feedback capacitor is connected if oscillation is undetected by the sensor.

15. The apparatus of claim 8, wherein the sensor further comprising a switch controlled current mirror to charge a sense point and another current mirror to discharge the sense point, and wherein the switch controlled current mirror provides higher current than the other current mirror if the switch is on, and the switch controlled current mirror provides lower average current than the other current mirror if the switch is turned on and off repeatedly by a varying voltage signal.

16. The apparatus of claim 15, wherein the switch is coupled to an amplified signal from the point between the first stage and second stage of the error amplifier.

17. A method for controlling oscillation in a voltage regulator, comprising:

receiving an input voltage;

outputting an output voltage based on the reference voltage and the input voltage; and sensing an oscillation at a node that is coupled to an output voltage and disposed between a first stage and a second stage of an error amplifier that is coupled between the input voltage and the output voltage, wherein if an oscillation is sensed at the node disposed between the first stage and the second stage, a compensation capacitance is connected between the error amplifiers first and second stage, and wherein if oscillation is undetected between the first and second stage of the error amplifier, the compensation capacitance is disconnected from these two stages.

18. The method of claim 17, further comprising disconnecting a feedback capacitor if oscillation is sensed at the node disposed between the first stage and second stage of the error amplifier, and connecting the feedback capacitor if oscillation is undetected at the node disposed between the first stage and the second stage of the error amplifier.

19. An apparatus for controlling oscillation in a regulator, comprising:

an input stage that receives an input voltage;

an output stage that regulates an output voltage based on a reference voltage and the input voltage; and an error amplifier that includes a sensor, wherein if an oscillation is sensed at a node coupled to the output voltage and disposed between a first stage and a second stage of the error amplifier, a first compensation capacitor is connected to a low side of the error amplifier's first stage and a second compensation capacitor is connected to a high side of the error amplifier's first stage, and wherein if oscillation is undetected between the first and second stage of the error amplifier, the first compensation capacitor is disconnected from the low side of the error amplifier's first stage and the second compensation capacitor is disconnected from the high side of the error amplifier's first stage;

wherein the sensor further comprises a switch controlled current mirror to charge a sense point and another current mirror to discharge the sense point, and wherein the switch controlled current mirror provides higher current than the other current mirror if the switch is on, and the switch controlled current mirror provides lower average current than the other current mirror if the switch is turned on and off repeatedly by a varying voltage signal.

20. The apparatus of claim 19, wherein the switch is coupled to an amplified signal from the node between the first stage and second stage of the error amplifier.

* * * * *